United States Patent
Chen et al.

(10) Patent No.: US 11,146,218 B2
(45) Date of Patent: Oct. 12, 2021

(54) AMPLIFICATION CIRCUIT

(71) Applicant: RichWave Technology Corp., Taipei (TW)

(72) Inventors: Chih-Sheng Chen, Taipei (TW); Chang-Yi Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 44 days.

(21) Appl. No.: 16/709,828

(22) Filed: Dec. 10, 2019

(65) Prior Publication Data
US 2020/0186101 A1    Jun. 11, 2020

(30) Foreign Application Priority Data
Dec. 11, 2018    (TW) .................................. 107144621

(51) Int. Cl.
| | |
|---|---|
| *H03F 1/32* | (2006.01) |
| *H03F 1/02* | (2006.01) |
| *H03F 3/21* | (2006.01) |

(52) U.S. Cl.
CPC ............ *H03F 1/32* (2013.01); *H03F 1/0211* (2013.01); *H03F 3/21* (2013.01); *H03F 2200/213* (2013.01); *H03F 2200/222* (2013.01); *H03F 2200/451* (2013.01)

(58) Field of Classification Search
CPC . H03F 1/32; H03F 1/0211; H03F 3/21; H03F 2200/213; H03F 2200/222; H03F 2200/451

USPC ........................................................ 330/296
See application file for complete search history.

(56) References Cited

U.S. PATENT DOCUMENTS

| | | | |
|---|---|---|---|
| 7,714,662 B2 | 5/2010 | Jeong | |
| 2012/0249191 A1 | 10/2012 | Marie | |
| 2018/0138881 A1* | 5/2018 | Long | ..................... H03G 3/3042 |
| 2018/0234057 A1* | 8/2018 | Chen | ..................... H03F 1/0261 |

FOREIGN PATENT DOCUMENTS

| | | |
|---|---|---|
| JP | 2004-534470 | 11/2004 |
| TW | 201642583 A | 12/2016 |
| TW | 201722068 A | 6/2017 |
| TW | 201824740 A | 7/2018 |

* cited by examiner

*Primary Examiner* — Hafizur Rahman
(74) *Attorney, Agent, or Firm* — Winston Hsu

(57) ABSTRACT

An amplification circuit includes an input terminal, an output terminal, a capacitor, a bias unit, an amplification unit, and an impedance unit. The input terminal receives a radio frequency signal. The capacitor is coupled to the input terminal and the bias unit. The bias unit includes a transistor for controlling the bias current. The transistor has a first terminal for receiving a system voltage, and a control terminal coupled to the reference voltage terminal. The amplification unit has an input terminal coupled to the capacitor and the bias unit, and an output terminal coupled to the output terminal of the amplification circuit. The impedance unit has a first terminal coupled to the bias unit, and a second terminal coupled to the input terminal of the amplification circuit and the capacitor. The impedance unit adjusts the amplifying linearity of the amplification circuit according to a selection signal.

20 Claims, 4 Drawing Sheets

AMPLIFICATION CIRCUIT

CROSS REFERENCE TO RELATED APPLICATION

This application claims priority of Taiwan application No. 107144621, which was filed on Dec. 11, 2018, and is included herein by reference.

TECHNICAL FIELD

The present invention is related to an amplification circuit, and more particularly to an amplification circuit capable of maintaining the linearity in a low power mode.

BACKGROUND

In a wireless communications system, a power amplifier is often used to amplify and output a radio frequency (RF) signal. Power amplifiers may be operated in different power modes depending on the applications. For example, if the RF signal is strong enough or has a good quality, then the power amplifier may be operated in a low power mode to reduce the power consumption. Otherwise, if the RF signal is rather weak or has a poor quality, then the power amplifier may need to be operated in a high power mode to ensure that the signal quality meets the requirements.

In the prior art, the wireless communications system typically controls the operation modes of the power amplifiers by adjusting the magnitude of the bias currents received by the power amplifiers. For example, the system can operate the power amplifier in a low power mode by reducing the bias current received by the power amplifier. However, when the bias current is reduced, the power amplifier will have a sharp rise in the error vector magnitude (EVM) in the frequency band of some RF signals, thereby making the linearity of the power amplifier worse and reducing the output signal quality.

SUMMARY

One embodiment of the present invention discloses an amplification circuit. The amplification circuit includes an input terminal, an output terminal, a capacitor, a bias unit, an amplification unit, and an impedance unit.

The input terminal receives a radio frequency (RF) signal. The output terminal outputs the RF signal after the RF signal is amplified by the amplification circuit. The capacitor has a first terminal coupled to the input terminal, and a second terminal. The bias unit is coupled to the second terminal of the capacitor, and provides a bias current. The bias unit includes a transistor having a first terminal configured to receive a first system voltage, a second terminal, and a control terminal coupled to a reference voltage terminal. The transistor controls the bias current. The amplification unit has an input terminal coupled to the second terminal of the capacitor and the second terminal of the bias unit, and an output terminal coupled to the output terminal of the amplification circuit. The impedance unit has a first terminal coupled to the bias unit, and a second terminal coupled to the input terminal of the amplification circuit and the first terminal of the capacitor. The impedance unit adjusts the amplifying linearity of the amplification circuit according to a first selection signal.

Another embodiment of the present invention discloses an amplification circuit. The amplification circuit includes an input terminal, an output terminal, a capacitor, a bias unit, an amplification unit, and an impedance unit.

The input terminal receives an RF signal. The output terminal is configured to output the RF signal after the RF signal is amplified by the amplification circuit. The capacitor has a first terminal coupled to the input terminal, and a second terminal. The bias unit is coupled to the second terminal of the capacitor, and provides a bias current. The bias unit includes a transistor having a first terminal configured to receive a first system voltage, a second terminal, and a control terminal coupled to a reference voltage terminal. The transistor controls the bias current. The amplification unit has an input terminal coupled to the second terminal of the capacitor, and an output terminal coupled to the output terminal of the amplification circuit. The impedance unit has a first terminal coupled to the second terminal of the transistor, and a second terminal coupled to a second reference voltage terminal. The impedance unit adjusts the amplifying linearity of the amplification circuit according to a first selection signal.

DETAILED DESCRIPTION

Figure 1:
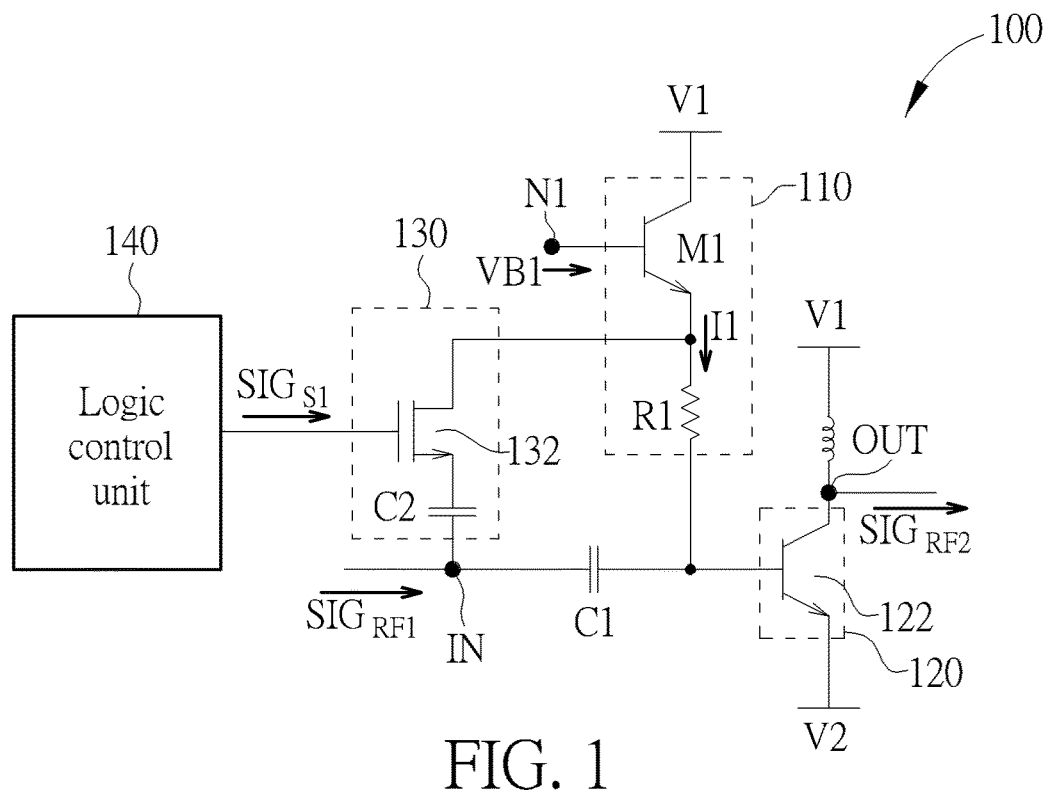
FIG. 1 shows an amplification circuit according to one embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows an amplification circuit 100 according to one embodiment of the present invention. The amplification circuit 100 includes an input terminal IN, an output terminal OUT, a capacitor C1, a bias unit 110, an amplification unit 120, and an impedance unit 130. The input terminal IN can receive the RF signal $SIG_{RF1}$, and the amplification circuit 100 can amplify the RF signal $SIG_{RF1}$ and output the amplified RF signal $SIG_{RF2}$ through the output terminal OUT.

The capacitor C1 has a first terminal coupled to the input terminal IN, and a second terminal. The bias unit 110 can be coupled to the second terminal of the capacitor C1, and can provide the bias current I1. In FIG. 1, the bias unit 110 can include a transistor M1 for controlling the bias current I1. The transistor M1 has a first terminal for receiving a system voltage V1, a second terminal, and a control terminal coupled to the reference voltage terminal N1 for receiving an external bias voltage VB1. Also, in FIG. 1, the bias unit 110 can further include a resistor R1. The resistor R1 has a first terminal coupled to the second terminal of the transistor M1, and a second terminal coupled to the input terminal of the amplification unit 120.

The amplification unit 120 has an input terminal coupled to the second terminal of the capacitor C1 and the second terminal of the bias unit 110, and an output terminal coupled to the output terminal OUT of the amplification circuit 100. That is, the amplification unit 120 can receive the bias current I1 provided by the bias unit 110 from the input terminal, amplify the RF signal $SIG_{RF1}$ that passes through the capacitor C1 accordingly, and output the RF signal $SIG_{RF2}$ through its output terminal. In FIG. 1, the amplification unit 120 can include a transistor 122. The transistor 122 has a first terminal coupled to the output terminal of the amplification unit 120, a second terminal for receiving a system voltage V2, and a control terminal coupled to the input terminal of the amplification unit 120. In some embodiments, the system voltage V1 can be, for example but not limited to, the operation voltage of the system, and the system voltage V2 can be, for example but not limited to, the reference voltage of the system, and the system voltage V1 can be higher than the system voltage V2.

The impedance unit 130 has a first terminal and a second terminal. The first terminal of the impedance unit 130 is coupled to the bias unit 110, for example to the second terminal of the transistor M1, and the second terminal of the impedance unit 130 can be coupled to the input terminal IN of the amplification circuit 100 and the capacitor C1. The impedance unit 130 can adjust the amplifying linearity of the amplification circuit 100 according to the selection signal $SIG_{S1}$. For example, when the amplification circuit 100 operates in the high power mode, the impedance unit 130 can increase the capacitive impedance according to the selection signal $SIG_{S1}$. Also, when the amplification circuit 100 operates in the low power mode, the impedance unit 130 can decrease the capacitive impedance according to the selection signal $SIG_{S1}$. Consequently, the amplification circuit 100 will be able to maintain the linearity in different power modes.

For example, in FIG. 1, the impedance unit 130 can include a switch 132 and a capacitor C2. The switch 132 and the capacitor C2 can be coupled in series between the first terminal and the second terminal of the impedance unit 130. Also, the switch 132 has a control terminal for receiving the selection signal $SIG_{S1}$. In this case, for example but not limited to, the selection signal $SIG_{S1}$ can turn on the switch 132 when the amplification circuit 100 operates in the high power mode, and the selection signal $SIG_{S1}$ can turn off the switch 132 when the amplification circuit 100 operates in the low power mode.

That is, when the amplification circuit 100 operates in the high power mode, the capacitive impedance of the impedance unit 130 will be greater than the capacitive impedance of the impedance unit 130 when in the low power mode. By decreasing the capacitive impedance of the amplification circuit 100 in the low power mode, the impedance of the amplification circuit 100 in the low power mode can be matched with the RF signals, thereby reducing the linear distortion of the amplification circuit 100 in the low power mode.

Furthermore, in FIG. 1, the amplification circuit 100 can further include a logic control unit 140. The logic control unit 140 can generate the selection signal $SIG_{S1}$ according to the operation mode of the amplification circuit 100 so as to adjust the capacitive impedance of the impedance unit 130 to meet the requirement of the amplification circuit 100.

In FIG. 1, the first terminal of the impedance unit 130 is coupled to the second terminal of the transistor M1, however, in some other embodiments, the first terminal of the impedance unit 130 can be coupled to the control terminal of the transistor M1.

Figure 2:
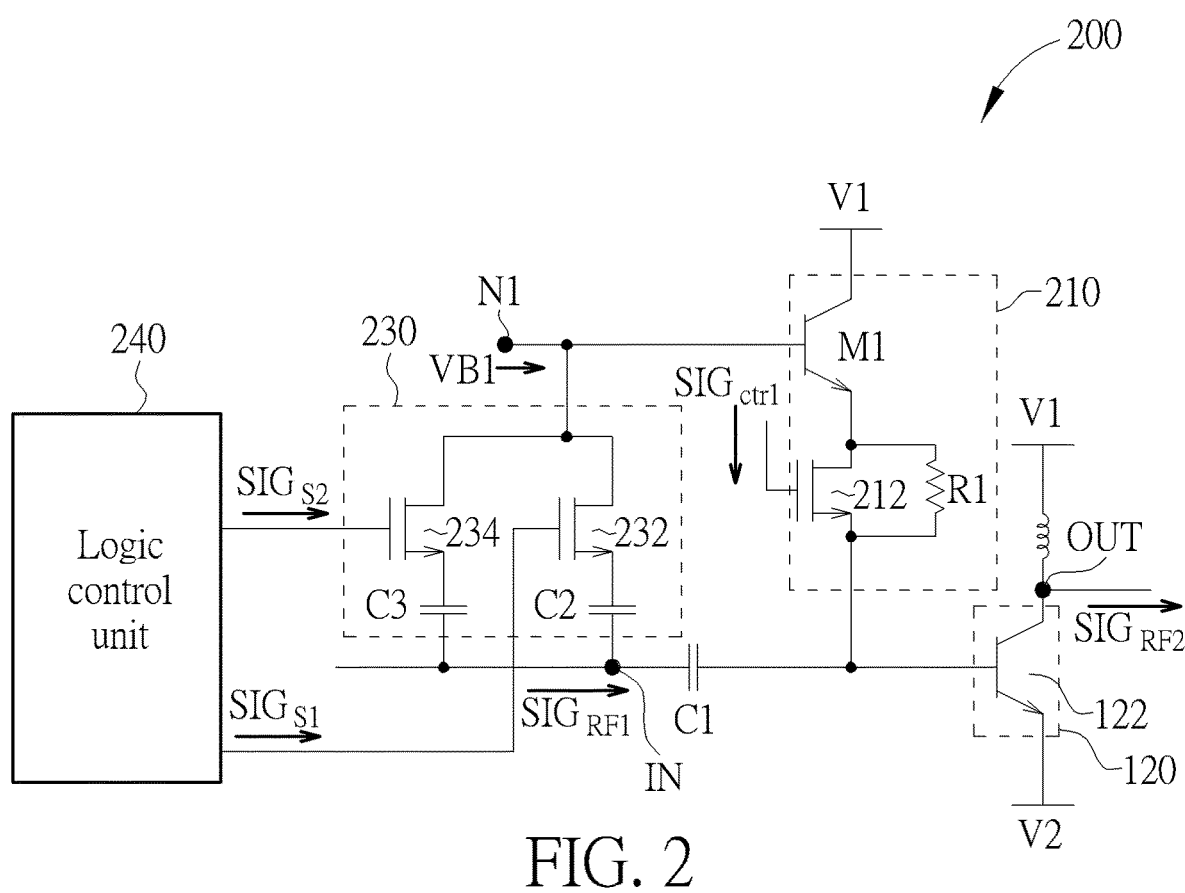
FIG. 2 shows an amplification circuit according to another embodiment of the present invention.

FIG. 2 shows an amplification circuit 200 according to another embodiment of the present invention. The amplification circuit 200 and the amplification circuit 100 have similar structures and can be operated with similar principles. However, in the amplification circuit 200, the first terminal of the impedance unit 230 can be coupled to the control terminal of the transistor M1. In addition, the impedance unit 230 can include switches 232 and 234, and capacitors C2 and C3. The switch 232 and the capacitor C2 can be coupled in series between the first terminal and the second terminal of the impedance unit 230. Also, the switch 234 and the capacitor C3 can be coupled in series between the first terminal and the second terminal of the impedance unit 230. That is, the series circuit formed by the switch 232 and the capacitor C2 is coupled in parallel with the series circuit formed by the switch 234 and the capacitor C3. In addition, in some embodiments, the capacitance of the capacitor C2 and the capacitance of the capacitor C3 may be the same or different according to the characteristics and requirements of the amplification circuit 200.

In some embodiments, the amplification circuit 200 can support more than two power modes, for example, the high power mode, the medium power mode, and the low power mode. In this case, the switches 232 and 234 can be controlled by different selection signals. For example, the control terminal of the switch 232 can receive the selection signal $SIG_{S1}$ while the control terminal of the switch 234 can receive the selection signal $SIG_{S2}$. For example, in FIG. 2, the amplification circuit 200 can further include the logic control unit 240. The logic control unit 240 can generate the selection signals $SIG_{S1}$ and $SIG_{S2}$ according to the operation mode of the amplification circuit 200 so as to adjust the capacitive impedance of the impedance unit 230 to meet the requirement of the amplification circuit 200. Consequently, for different power modes, the amplification circuit 200 can control the switches 232 and 234 individually. For example, turn on or off the switches 232 and 234 simultaneously, or turn on only one of the two switches 232 and 234, so that the impedance unit 230 can provide different capacitive impedances to meet the requirements of the amplification circuit 200 in different modes. Therefore, the linearity performance of the amplification circuit 200 can be improved in different operation modes.

In some embodiments, the impedance unit 230 can also replace the impedance unit 130 and can be applied in the amplification circuit 100. Also, the impedance unit 130 can replace the impedance unit 230 and can be applied in the amplification circuit 200.

Furthermore, in FIG. 2, the bias unit 210 can further include a resistor R1 coupled in parallel with the switch 212. That is, in some embodiments, the bias unit 210 can control the switch 212 with the control signal $SIG_{ctrl}$ to adjust the resistance on the path of the bias current so as to protect the transistor M1 and improve the stability of the amplification circuit 200. In some embodiments, the bias unit 210 can replace the bias unit 110 and can be applied in the amplification circuit 100. In addition, in some embodiments, the resistor R1 can be a variable resistor. In this case, the bias units 110 and 210 can adjust the resistance of the resistor R1 directly without coupling the switch 212 in parallel.

Figure 3:
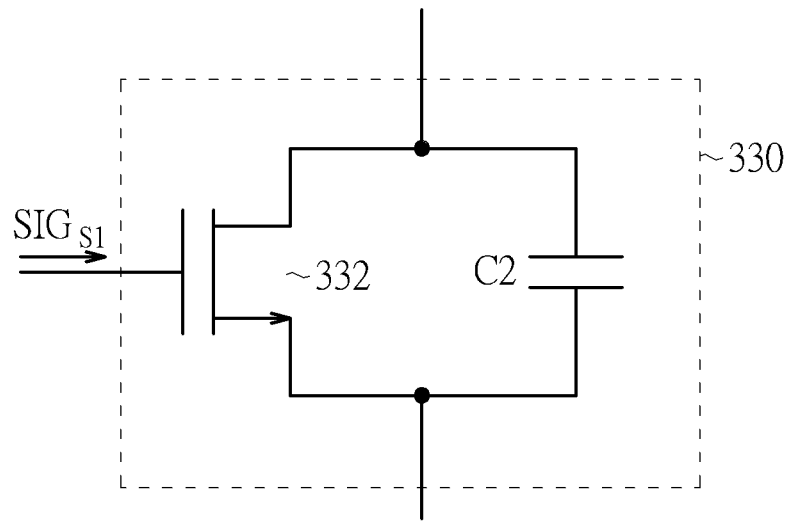
FIG. 3 shows an impedance unit according to another embodiment of the present invention.

In FIGS. 1 and 2, the impedance units 130 and 230 both include switches and capacitors coupled in series. However, FIG. 3 shows an impedance unit 330 according to another embodiment of the present invention. In FIG. 3, the impedance unit 330 can include a switch 332 and a capacitor C2. The switch 332 and the capacitor C2 can be coupled in parallel between the first terminal and the second terminal of the impedance unit 330. In this case, by turning on or off the switch 332 with the selection signal $SIG_{S1}$, the capacitive impedance provided by the impedance unit 330 can be adjusted. In some embodiments, the impedance unit 330 can replace the impedance units 130 and 230 and can be applied in the amplification circuits 100 and 200. By using the impedance unit 330 to provide the capacitive impedance appropriately in different power modes, the linearity of the amplification circuit in the low power mode can be effectively improved.

Figure 4:
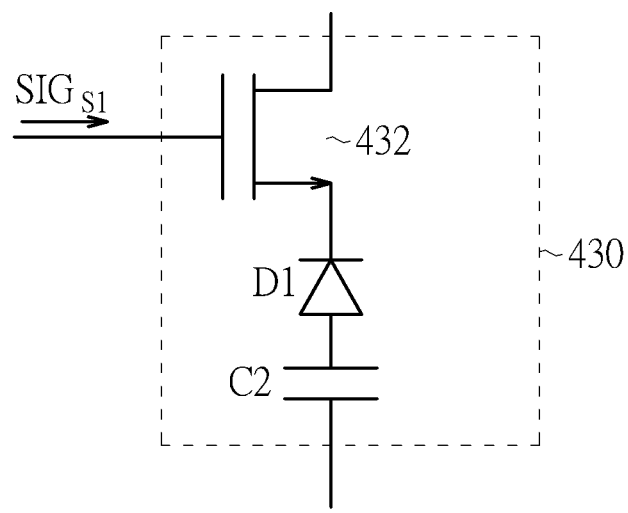
FIG. 4 shows an impedance unit according to another embodiment of the present invention.

FIG. 4 shows an impedance unit 430 according to another embodiment. In FIG. 4, the impedance unit 430 can include a switch 432, a diode D1, and a capacitor C2. Also, the switch 432, the diode D1, and the capacitor C2 can be coupled in series between the first terminal and the second terminal of the impedance unit 430. In this case, by turning on or off the switch 432 with the selection signal $SIG_{S1}$, the capacitive impedance provided by the impedance unit 430 can be adjusted. In some embodiments, the impedance unit 430 can replace the impedance units 130 and 230 and can be applied in the amplification circuits 100 and 200. By using the impedance unit 430 to provide the capacitive impedance appropriately in different power modes, the linearity of the amplification circuit in the low power mode can be effectively improved.

Figure 5:
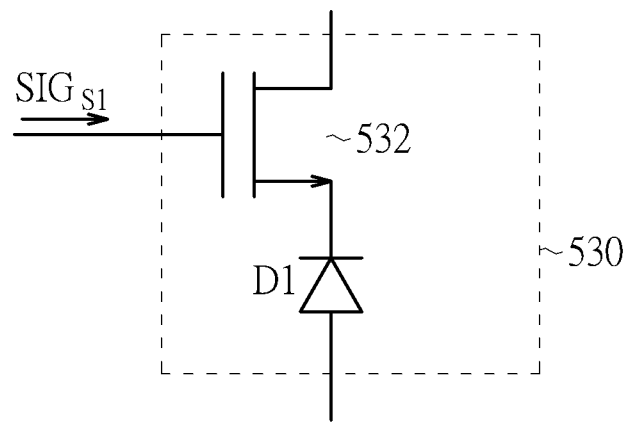
FIG. 5 shows an impedance unit according to another embodiment of the present invention.

In addition, since the diode D1 can also provide the capacitive impedance, the impedance unit 430 may omit the capacitor C2 in some embodiments. FIG. 5 shows an impedance unit 530 according to another embodiment of the present invention. In FIG. 5, the impedance unit 530 can include a switch 532, and a diode D1. Additionally, the switch 532 and the diode D1 can be coupled in series between the first terminal and the second terminal of the impedance unit 530. In this case, by turning on or off the switch 532 with the selection signal $SIG_{S1}$, the capacitive impedance provided by the impedance unit 530 can be adjusted. In some embodiments, the impedance unit 530 can replace the impedance units 130 and 230 and can be applied in the amplification circuits 100 and 200. By using the impedance unit 530 to provide the capacitive impedance appropriately in different power modes, the linearity of the amplification circuit in the low power mode can be effectively improved.

Figure 6:
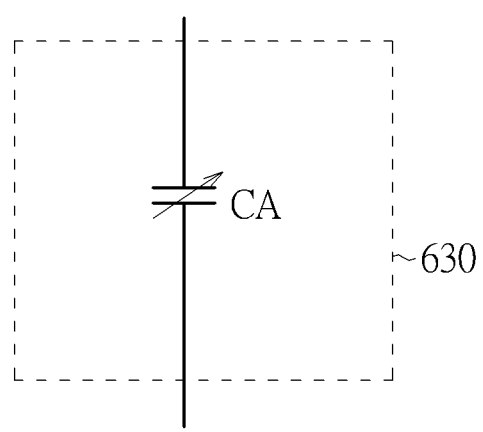
FIG. 6 shows an impedance unit according to another embodiment of the present invention.

FIG. 6 shows an impedance unit 630 according to another embodiment of the present invention. In FIG. 6, the impedance unit 630 can include a variable capacitor CA. In this case, the selection signal $SIG_{S1}$ can adjust the capacitance of the capacitor CA according to the power mode of the amplification circuit. Consequently, the impedance unit 630 can also replace the impedance units 130 and 230, and can be applied in the amplification circuits 100 and 200. By using the impedance unit 630 to provide the capacitive impedance appropriately in different power modes, the linearity of the amplification circuit in the low power mode can be effectively improved.

In FIGS. 1 and 2, the impedance units 130 and 230 are coupled to the input terminals IN of the amplification circuits 100 and 200. However, in some other embodiments, the impedance unit can also be coupled to other places.

Figure 7:
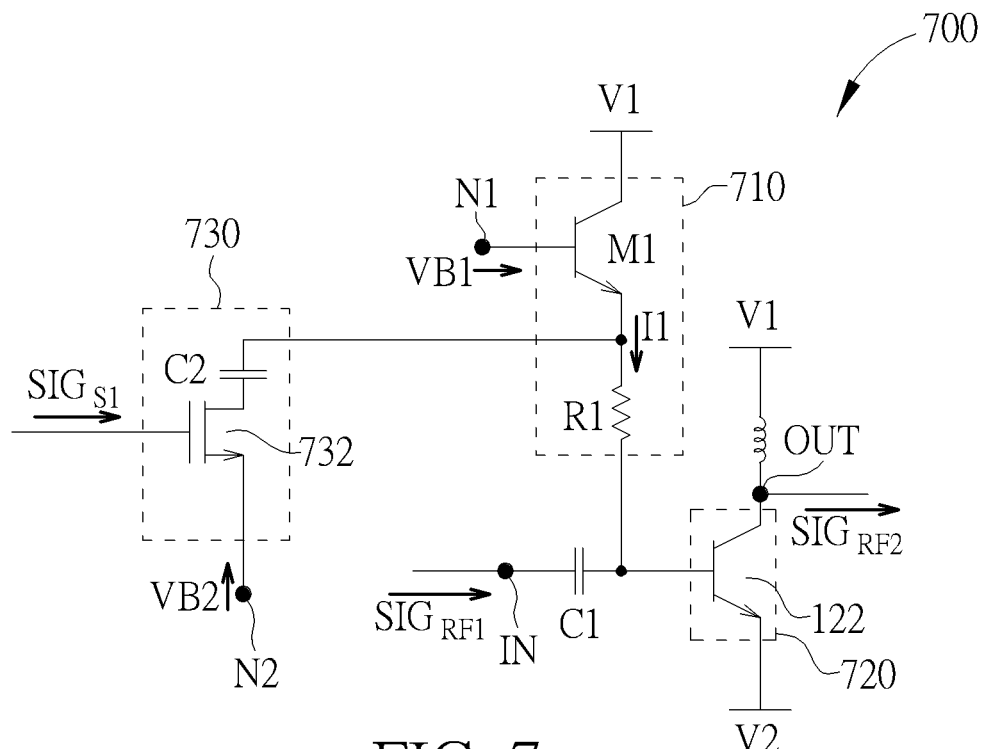
FIG. 7 shows an amplification circuit according to another embodiment of the present invention.

FIG. 7 shows an amplification circuit 700 according to another embodiment of the present invention. The amplification circuit 700 can include the input terminal IN, the output terminal OUT, the capacitor C1, the bias unit 710, the amplification unit 720, and the impedance unit 730. The input terminal IN can receive the RF signal $SIG_{RF1}$, and the amplification circuit 700 can amplify the RF signal $SIG_{RF1}$ and output the amplified RF signal $SIG_{RF2}$ through the output terminal OUT.

The capacitor C1 has a first terminal coupled to the input terminal IN, and a second terminal. The bias unit 710 can be coupled to the second terminal of the capacitor C1, and can provide the bias current I1. The bias unit 710 can include a transistor M1 and a resistor R1. The bias unit 710 can control the bias current I1 through the transistor M1, and can protect the transistor M1 with the resistor R1. The transistor M1 has a first terminal for receiving the system voltage V1, a second terminal, and a control terminal coupled to the reference voltage terminal N1. The resistor R1 has a first terminal coupled to the second terminal of the transistor M1, and a second terminal coupled to the input terminal of the amplification unit 720.

The amplification unit 720 has an input terminal coupled to the second terminal of the capacitor C1, and an output terminal coupled to the output terminal OUT of the amplification circuit 700.

The impedance unit 730 has a first terminal coupled to the second terminal of the transistor M1, and a second terminal coupled to the reference voltage terminal N2. The impedance unit 730 can adjust the amplifying linearity of the amplification circuit 700 according to the selection signal $SIG_{S1}$.

In some embodiments, the impedance units 730 and 130 have the similar structures and can be operated with similar principles. For example, when the amplification circuit 700 operates in the high power mode, the impedance unit 730 can turn on the switch 732 to increase the capacitive impedance according to the selection signal $SIG_{S1}$. Also, when the amplification circuit 700 operates in the low power mode, the impedance unit 730 can turn off the switch 732 to decrease the capacitive impedance according to the selection signal $SIG_{S1}$.

A difference between the amplification circuits 100 and 700 is that the second terminal of the impedance unit 730 can be coupled to the reference voltage terminal N2. In some embodiments, the reference voltage terminal N1 can provide an external bias voltage VB1, and the reference voltage terminal N2 can provide an external bias voltage VB2. For example, the reference voltage terminal N1 and the reference voltage terminal N2 can be coupled to external power sources, and can provide the external bias voltage VB1 and the external bias voltage VB2 according to the voltages generated by the external power sources.

Figure 8:
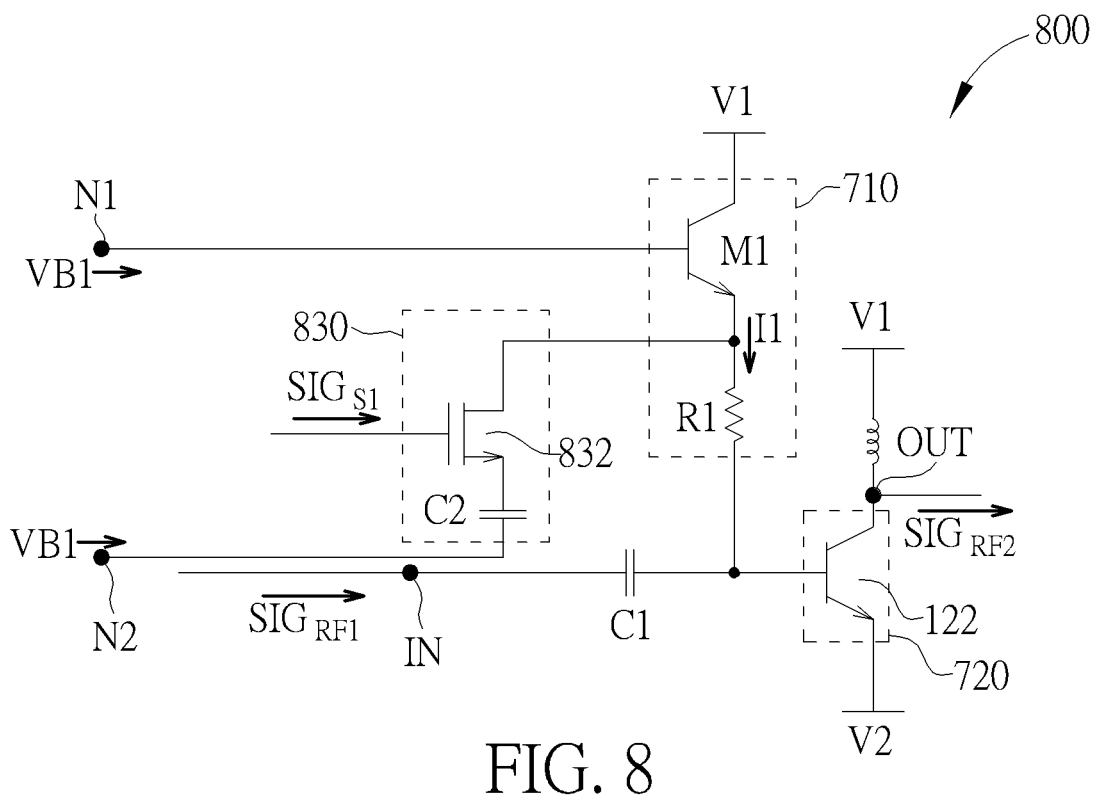
FIG. 8 shows an amplification circuit according to another embodiment of the present invention.

However, the reference voltage terminal N1 and the reference voltage terminal are not limited to providing different bias voltages. In some other embodiments, the bias voltage provided by the reference voltage terminal N2 can be substantially equal to the bias voltage provided by the reference voltage terminal N1. FIG. 8 shows an amplification circuit 800 according to another embodiment of the present invention. In the amplification circuit 800, the reference voltage terminal N2 can also provide the external bias voltage VB1 for the second terminal of the impedance unit 830 in the amplification circuit 800. That is, the reference voltage terminal N1 and the reference voltage terminal N2 can be substantially the same voltage terminal for providing the same external bias voltage VB1.

In FIG. 8, the impedance unit 830 and the impedance unit 730 have similar structures. For example, the impedance unit 830 can also include a switch 832 and a capacitor C2 coupled in series. However, the switch 732 can be coupled between the capacitor C2 and the reference voltage terminal N2 as shown in FIG. 7 while the capacitor C2 can be coupled between the switch 832 and the reference voltage terminal N2 as shown in FIG. 8. Furthermore, in some embodiments, the impedance units 230 to 630 shown in FIGS. 2 to 6 can also be used to replace the impedance units 730 and 830 in the amplification circuits 700 and 800, and can be coupled to the second terminal of the transistor M1 and the reference voltage terminal N2.

Since the amplification circuits 700 and 800 can adjust the capacitive impedance through the impedance units 730 and 830, the corresponding capacitive impedance can be provided to maintain the linearity of the amplification circuits 700 and 800 when the amplification circuits operate in different power modes.

In summary, the amplification circuits provided by the embodiments of the present invention can adjust the capacitive impedance with the impedance units. Therefore, when the amplification circuits operate in different power modes, the impedance units can provide the corresponding capacitive impedance to maintain the linearity of the amplification circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplification circuit comprising:
an input terminal configured to receive a radio frequency (RF) signal;
an output terminal configured to output the RF signal after the RF signal is amplified by the amplification circuit;
a first capacitor having a first terminal and a second terminal, wherein the first terminal is coupled to the input terminal;
a bias unit coupled to the second terminal of the first capacitor, and configured to provide a bias current, wherein the bias unit comprises:
a transistor having a first terminal, a second terminal and a control terminal, wherein the first terminal is configured to receive a first system voltage, and the control terminal is coupled to a reference voltage terminal, wherein the transistor is configured to control the bias current;
an amplification unit having an input terminal coupled to the second terminal of the first capacitor and the second terminal of the bias unit, and an output terminal coupled to the output terminal of the amplification circuit; and
an impedance unit having a first terminal coupled to the bias unit, and a second terminal coupled to the input terminal of the amplification circuit and the first terminal of the first capacitor, and the impedance unit being configured to adjust amplifying linearity of the amplification circuit according to a first selection signal;
the amplification circuit operates in a high power mode or in a low power mode, in the high power mode, the impedance unit increases a capacitive impedance according to the first selection signal and in the low power mode, the impedance unit decreases the capacitive impedance according to the first selection signal.

2. An amplification circuit comprising:
an input terminal configured to receive a radio frequency (RF) signal;
an output terminal configured to output the RF signal after the RF signal is amplified by the amplification circuit;
a first capacitor having a first terminal and a second terminal, wherein the first terminal is coupled to the input terminal;
a bias unit coupled to the second terminal of the first capacitor, and configured to provide a bias current, wherein the bias unit comprises:
a transistor having a first terminal, a second terminal and a control terminal, wherein the first terminal is configured to receive a first system voltage, and the control terminal is coupled to a reference voltage terminal, wherein the transistor is configured to control the bias current;
an amplification unit having an input terminal coupled to the second terminal of the first capacitor and the second terminal of the bias unit, and an output terminal coupled to the output terminal of the amplification circuit; and
an impedance unit having a first terminal coupled to the bias unit, and a second terminal coupled to the input terminal of the amplification circuit and the first terminal of the first capacitor, and the impedance unit being configured to adjust amplifying linearity of the amplification circuit according to a first selection signal;
wherein the impedance unit comprises a variable capacitor configured to adjust capacitance according to the first selection signal.

3. The amplification circuit of claim 1, wherein the first terminal of the impedance unit is coupled to the second terminal or the control terminal of the transistor.

4. The amplification circuit of claim 1, wherein the impedance unit comprises a first switch and a second capacitor, and the first switch has a control terminal configured to receive the first selection signal.

5. The amplification circuit of claim 4, wherein:
the first switch further has a first terminal and a second terminal, wherein the first terminal of the first switch is coupled to the first terminal of the impedance unit; and
the second capacitor has a first terminal coupled to the second terminal of the first switch, and a second terminal coupled to the second terminal of the impedance unit.

6. The amplification circuit of claim 4, wherein:
the second capacitor has a first terminal and a second terminal, wherein the first terminal of the second capacitor is coupled to the first terminal of the impedance unit; and
the first switch further has a first terminal coupled to the second terminal of the second capacitor, and a second terminal coupled to the second terminal of the impedance unit.

7. The amplification circuit of claim 4, wherein the impedance unit further comprises:
a second switch having a control terminal configured to receive a second selection signal; and
a third capacitor coupled in series with the second switch between the first terminal and the second terminal of the impedance unit;

wherein a series circuit formed by the first switch and the second capacitor is coupled in parallel with a series circuit formed by the second switch and the third capacitor.

8. The amplification circuit of claim 4, wherein the first switch and the second capacitor are coupled in parallel between the first terminal and the second terminal of the impedance unit.

9. The amplification circuit of claim 4, wherein the impedance unit further comprises a diode, coupled in series with the first switch and the second capacitor between the first terminal and the second terminal of the impedance unit.

10. The amplification circuit of claim 4, wherein:
when the amplification circuit operates in a high power mode, the first selection signal turns on the first switch; and
when the amplification circuit operates in a low power mode, the first selection signal turns off the first switch.

11. The amplification circuit of claim 1, wherein the impedance unit comprises a variable capacitor configured to adjust capacitance according to the first selection signal.

12. The amplification circuit of claim 1, wherein the impedance unit comprises:
a first switch having a control terminal configured to receive the first selection signal; and
a diode coupled in series with the first switch between the first terminal and the second terminal of the impedance unit.

13. The amplification circuit of claim 1, wherein the bias unit further comprises a resistor having a first terminal coupled to the second terminal of the transistor, and a second terminal coupled to the input terminal of the amplification unit.

14. The amplification circuit of claim 13, wherein the bias unit further comprises a third switch coupled in parallel with the resistor.

15. An amplification circuit comprising:
an input terminal configured to receive a radio frequency (RF) signal;
an output terminal configured to output the RF signal after the RF signal amplified by the amplification circuit;
a first capacitor having a first terminal and a second terminal, wherein the first terminal is coupled to the input terminal;
a bias unit coupled to the second terminal of the first capacitor, and configured to provide a bias current, wherein the bias unit comprises:
a transistor having a first terminal, a second terminal and a control terminal, wherein the first terminal is configured to receive a first system voltage, and the control terminal is coupled to a first reference voltage terminal, wherein the transistor is configured to control the bias current;
an amplification unit having an input terminal coupled to the second terminal of the first capacitor, and an output terminal coupled to the output terminal of the amplification circuit; and
an impedance unit having a first terminal coupled to the second terminal of the transistor, and a second terminal coupled to a second reference voltage terminal, and the impedance unit being configured to adjust amplifying linearity of the amplification circuit according to a first selection signal;

the amplification circuit operates in a high power mode or in a low power mode, in the high power mode, the impedance unit increases a capacitive impedance according to the first selection signal and in the low power mode, the impedance unit decreases the capacitive impedance according to the first selection signal.

16. An amplification circuit comprising:
an input terminal configured to receive a radio frequency (RF) signal;
an output terminal configured to output the RF signal after the RF signal is amplified by the amplification circuit;
a first capacitor having a first terminal and a second terminal, wherein the first terminal is coupled to the input terminal;
a bias unit coupled to the second terminal of the first capacitor, and configured to provide a bias current, wherein the bias unit comprises:
a transistor having a first terminal, a second terminal and a control terminal, wherein the first terminal is configured to receive a first system voltage, and the control terminal is coupled to a reference voltage terminal, wherein the transistor is configured to control the bias current;
an amplification unit having an input terminal coupled to the second terminal of the first capacitor and the second terminal of the bias unit, and an output terminal coupled to the output terminal of the amplification circuit; and
an impedance unit having a first terminal coupled to the bias unit, and a second terminal coupled to the input terminal of the amplification circuit and the first terminal of the first capacitor, and the impedance unit being configured to adjust amplifying linearity of the amplification circuit according to a first selection signal;
wherein the impedance unit comprises:
a first switch having a control terminal configured to receive the first selection signal; and
a diode coupled in series with the first switch between the first terminal and the second terminal of the impedance unit.

17. The amplification circuit of claim 15, wherein the first reference voltage terminal is configured to provide a first external bias voltage, and the second reference voltage terminal is configured to provide a second external bias voltage.

18. The amplification circuit of claim 17, wherein the second external bias voltage is substantially equal to the first external bias voltage.

19. The amplification circuit of claim 15, wherein the impedance unit comprises a first switch and a second capacitor, and the first switch has a control terminal configured to receive the first selection signal.

20. The amplification circuit of claim 19, wherein:
when the amplification circuit operates in a high power mode, the first selection signal turns on the first switch; and
when the amplification circuit operates in a low power mode, the first selection signal turns off the first switch.

* * * * *